Figure 6:
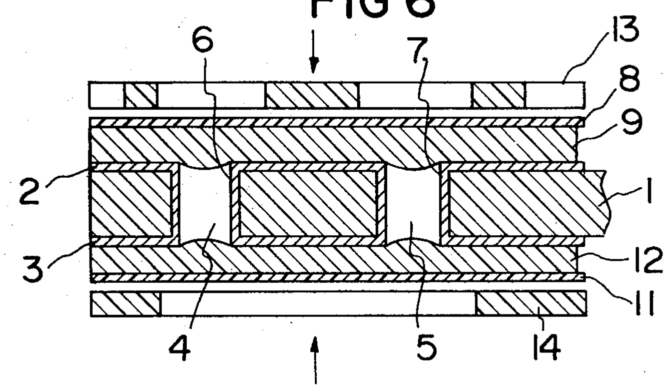

United States Patent [19]

Taguchi et al.

[11] 4,301,230

[45] Nov. 17, 1981

[54] ORIENTED POLYSTYRENE SUPPORT FOR PHOTOPOLYMERIZABLE ELEMENT

[75] Inventors: Tadashi Taguchi, Kawasaki; Noboru Fujikawa, Tokyo; Mitsuo Kohno, Yokohama; Katsumi Yoshitake, Yokosuka; Kunio Satake, Yokohama, all of Japan

[73] Assignee: Asahi Kasei Kogyo Kabushiki Kaisha, Kitaku-Osaka, Japan

[21] Appl. No.: 104,944

[22] Filed: Dec. 18, 1979

Related U.S. Application Data

[62] Division of Ser. No. 923,763, Jul. 11, 1978, Pat. No. 4,211,560.

[30] Foreign Application Priority Data

Jul. 12, 1977 [JP] Japan .............................. 52/82573
Dec. 26, 1977 [JP] Japan .............................. 52/157091

[51] Int. Cl.$^3$ ........................ G03C 1/76; G03C 3/00; G03C 1/78

[52] U.S. Cl. .............................. 430/273; 430/166; 430/271; 430/319; 430/496; 430/501; 430/509; 430/531; 430/534; 430/536; 430/537; 430/935; 430/939; 430/961

[58] Field of Search ............... 430/271, 273, 311, 319, 430/495, 496, 523, 533, 935, 939, 461, 162, 155, 165, 166, 536, 537, 502, 509, 501, 531, 534

[56] References Cited

U.S. PATENT DOCUMENTS

| | | | |
|---|---|---|---|
| 3,186,844 | 6/1965 | Alles et al. | 430/271 |
| 3,458,311 | 7/1969 | Alles | 430/273 |
| 3,469,982 | 9/1969 | Celeste | 430/256 |
| 3,895,949 | 7/1975 | Akamatsu et al. | 430/275 |
| 4,072,527 | 2/1978 | Fan | 430/273 |
| 4,126,466 | 11/1978 | Roos | 430/271 |
| 4,217,407 | 8/1980 | Watanabe et al. | 430/166 |

*Primary Examiner*—Edward C. Kimlin
*Attorney, Agent, or Firm*—Sprung, Felfe, Horn, Lynch & Kramer

[57] ABSTRACT

A process for producing an image which comprises the steps of:

(1) applying to the surface of a substrate the surface of a photosensitive layer, the other surface of the photosensitive layer being adhered to a substantially transparent film support which is soluble or dispersible in a developer consisting essentially of a liquid capable of substantially dissolving or dispersing therein the areas of the layer other than those having a polymeric image produced by imagewise exposure in the step (2) below;

(2) exposing the photosensitive layer, imagewise, to actinic radiation to form a polymeric image in the layer; and (3) washing away with the developer the film support and the areas of the layer other than those having the polymeric image to form an image of a polymeric material on the substrate. The photosensitive element having on its one side the above-mentioned specific film support and the process have a variety of applications and are useful for producing photoresists which are advantageously used for making printed circuit boards.

14 Claims, 9 Drawing Figures

8
9
10

FIG 1
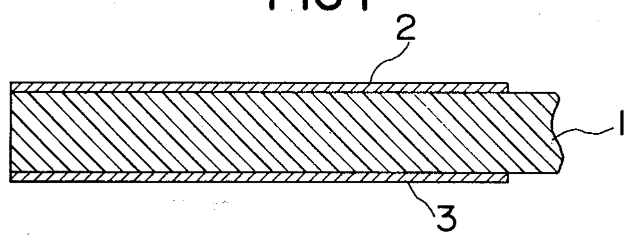
FIG 2
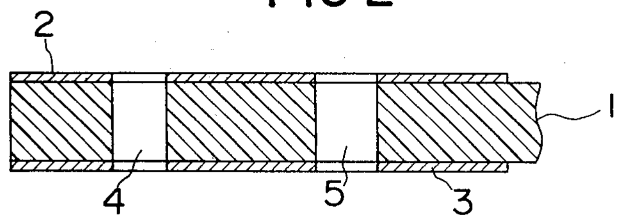
FIG 3
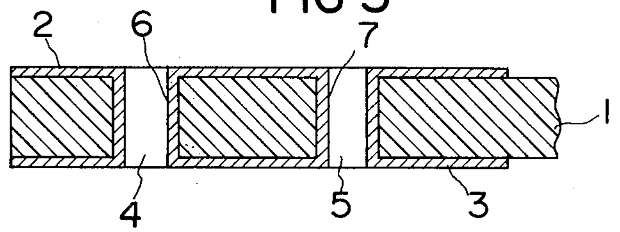
FIG 4
8
9
10
FIG5
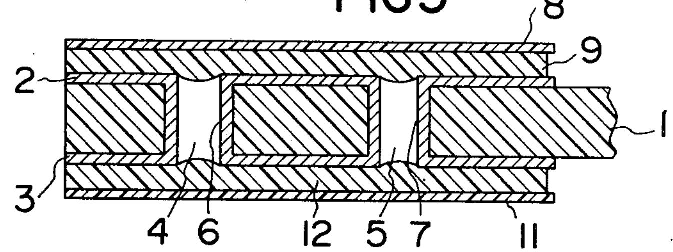

ORIENTED POLYSTYRENE SUPPORT FOR PHOTOPOLYMERIZABLE ELEMENT

This is a division of Application Ser. No. 923,763, filed Jul. 11, 1978 now U.S. Pat. No. 4,211,560.

This invention relates to a photosensitive element, a process for producing an image using the photosensitive element and applications thereof. More particularly, the invention relates to a photosensitive element comprising a photosensitive layer and a support which is soluble or dispersible in a developer consisting essentially of a liquid capable of substantially dissolving or dispersing therein the areas of the layer other than those having a polymeric image produced by imagewise exposure and is substantially transparent to actinic rays, and also relates to a process for producing an image using this photosensitive element. The element and process of this invention have a variety of applications, but may be employed for producing photoresists with great advantages.

Various processes and elements have been proposed for producing photoresists which are useful for the production of printed circuit boards. For example, as a first instance of the conventional processes for making photoresists, it is known to directly coat a photosensitive liquid composition onto a substrate, dry the composition, imagewise expose the layer of the composiiton to actinic radiation and develop the layer with a liquid developer. As a second instance of the conventinoal processes, it is also known to use a photosensitive element comprising a flexible support film a flexible photosensitive layer having adherence to a substrate and laminated onto the flexible support film and a protective film covering the other surface of the photosensitive layer to prevent blocking at the winding step and adhesion of dusts during handling. In the second instance, the production of photoresists are done by the steps of stripping the protective film, applying the photosensitive layer of the element to the substrate, exposing the photosensitive layer, imagewise, to actinic radiation, stripping the support film either before or after imagewise exposure and developing the lyaer with a liquid developer (see, for example, U.S. Pat. No. 3,469,982). In the former case, the users purchase the photosensitive liquid composition as such and coat it onto the substrate. Accordingly, the users are required to have the skill in the technique of uniformly coating the liquid compositon onto the substrate. In the latter case, although there is such an advantage that the skill required for the former case is not needed because the provision of the photosensitive layer on the substrate is easily effeceted only by the steps of stripping the protective film and subsequently applying the photosensitive layer onto the substrate, some difficulties are stil encountered. Illustratively stated, in the photoresist element employed in the latter case, the support film for bearing the photosensitive layer must have flexibility. In addition, it is indispensable that the adhesion between the substrate and the photosensitive layer should be larger than the adhesion between the film support and the photosensitive layer.

When the photoresist element to be employed in the above-mentioned second instance of the conventional processes is employed for the production of aprinted circuit board, the protective film is stripped and the photosensitive layer it then applied to a substrate for producing thereon a permanent image, such as a copper-clad epoxy resin plate. If the film support is opaque, the film support is then stripped and the photosensitive layer is exposed imagewise to actinic radiation. If the film support is transparent, the photosensitive layer may be exposed imagewise to actinic radiation either before or after stripping of the film support. In either case, the film support is necessarily stripped prior to development. There, the non-imaged areas of the photosensitive layer are dissolved away using a liquid developer to form a resist image on the surface of the substrate. Thereafter, etching is effected to obtain an intended printed circuit board.

At present, a polyethylene terephthalate film is most popularly used as the film support because it has a high nerve and a good evenness. Since this film has polar groups in the molecular structure, it has a considerable adhesion to the photosensitive layer. In case a resist film comprising such a film support and a photosensitive layer is laminated onto a substrate such as copper-clad epoxy resin plate, the substrate and/or the resist film is heated and pressure lamination is then effected so as to attain good adherence between the photosensitive layer and the substrate. If heating and/or pressure application is not uniform and/or the substrate is warped, uniform adhesion between the substrate and photosensitive layer cannot be attained, and therefore, when the film support is stripped, there is often caused such a trouble that part of the photosensitive layer remains attached to the film support and the former is removed together with the latter. It is not practically acceptable to subject the substrate having thereon such an incomplete lamination to the subsequent step such as development. Further, if the temperature at the heat-lamination step is low, the adhesion between the substrate and the photosensitive layer is sometimes insufficient, leading to such a trouble that when the film support is stripped, the photosensitive layer is peeled off together with the film support. This undesirable trouble takes place when the adhesion between the film support and the photosensitive layer is larger than the adhesion between the substrate and the the photosensitive layer.

Reduction of the thickness of the photosensitive layer is an effective means for improving the resolution of a resist image produced therefrom. However, if the thickness of the photosensitive layer is reduced, the absolute value of cohesion of the layer is lowered, and hence there is caused occurrence of such an undesirable phenomenon that the photosensitive layer is destroyed when the film support is stripped. Therefore, there is inevitablly limitation with respect to the reduction of the thickness of the photosensitive layer The foregoing defects and disadvantages are inevitably involved in the conventional processes using liquid-development type photosensitive elements for producing photoresists.

It is therefore a principal object of this invention to provide a new and improved process for producing an image which is particularly useful as a photoresist. Another object is to provide a rapid and practical process for producing a durable photoresist useful for the production of a printed circuit board. It is still another object of this invention to provide an improved and practical method for the production of a printed circuit board. A further object is to provide a preformed photosensitive resist element useful for practicing the processes as described above.

We made intensive researches with a view to obviating the defects and disadvantages involved in the conventional techniques. As a result, it was found that the purpose of our researches can be simply attained by the use of a photosensitive element comprising a layer made of a photosensitive composition and a film support made of a transparent material such as a transparent polymeric material and laminated on the surface of the photosensitive composition layer which support is soluble or dispersible in a developer consisting essentialy of a liquid capable of substantially dissolving or dispersing therein the areas of the photosensitive composition layer other than those having a polymeric image produced by imagewise exposure. In order to produce a resist image on a substrate by the use of the above-mentioned photosensitive element, there is employed a process comprising applying the photosensitive layer of the element onto the substrate and exposing the photosensitive layer, imagewise, to actinic rays to form a polymeric image, directly followed by development without stripping from the layer the film support. In the process, the film support is advantageously washed away together with the areas of the photosensitive composition layer other than those having the polymeric image by using the developer.

Essentially, in accordance with the present invention, there is provided a process for producing an image, which comprises the steps of:

(1) applying to the surface of a substrate the surface of a photosensitive composition layer having adherence to the substrate, while the other surface of the photosensitive composition layer has adhered to a substantially transparent film support which is soluble or dispersible in a developer consisting essentialy of a liquid capable of substantially dissolving or dispersing therein the areas of the layer other than those having a polymeric image produced by imagewise exposure in the step (2) below and capable of transmitting actinic rays, the application of the surface of the photosensitive compostion layer to the surface of the substrate being effected after stripping of a protective film in case the protective film has been provided on the surface of the photosensitive composition layer remote from the film support;

(2) exposing the photosensitive composition layer, imagewise, to actinic radiation to form a polymeric image in the lyaer; and (3) washing away with the developer the film support and the areas of the layer other than those having the polymeric image to form an image of a polymeric material on the substrate.

Either a photopolymerizable composition or a photodegradable compositon may be employed as the photosensitive composition to be used in this invention. The photopolymerizable composition is used for formation of a negative image while the photodegradable composition is used for formation of a positive image. In general, negative working photosensitive compositions are employed in most cases. Accordingly, the following description will be made mainly with reference to an embodiment in which a photopolymerizable composition is used as the photosensitive composition.

A process for producing an image according to this invention is practiced, for example, as follows. If a photosensitive element comprising a photopolymerizable layer made of photopolymerizable composition and capable of being dissolved or dispersed in a liquid developer and a film support attached to one surface of the layer is provided on the other surface of the photopolymerizable layer with a protective film, the protective film is firstly stripped. The surface of a photopolymerizable layer of the photosensitive element is laminated and attached to the surface of a substrate such as a copper-clad plate. Subsequently, the photopolymerizable layer is imagewise exposed to actinic radiation to form a polymeric image by photopolymerization of the photopolymerizable composition. The film support and the unexposed areas of the layer are then washed away with the liquid developer to form an image of a polymeric material on the surface of the substrate.

In case the so formed image of the polymeric material is used as a resist image for the production of a printed circuit board, the subsequent procedures are as follows. The resist image bearing substrate is dipped in an etching solution containing ferric chloride or the like, whereby the bared surface portions of the substrate which are made of copper or the like and unprotected by the resist image are etched away. The so treated substrate is picked up from the etching solution, and the resist image is removed to obtain a desired printed circuit board.

At the step of lamination of a photosensitive layer to a substrate, the temperature of the surface of the substrate and/or the surface of the photosensitive layer remote from a film support and the pressure to be applied between the substrate and the photosensitive layer may be varied depending on the kinds of the substrate and the photosensitive layer. But the temperature is usually about 0° to about 160° C., preferably about 10° to about 120° C. and the pressure is usually about 0.1 to about 20 Kg/cm$^2$G, preferably about 0.5 to about 5.0 Kg/cm$^2$G.

The photopolymerizable type photosensitive elements useful for producing photoresists comprises, as essential elements, a transparent film support and a photopolymerizable layer including an organic binder selected from polymeric materials capable of being dissolved or dispersed in an organic solvent to be used as the developer, and optionally it further comprises a protective film.

In this invention, a transparent film support capable of being dissolved or dispersed in a developer may be a film having either no orientation or orientation. In general, a support film having orientation, such as a monoaxially or biaxially oriented film, is preferred. As the materials of the suport film, there can be mentioned various kinds of polymers, for example, methyl methacrylate homopolymer and copolymers with a monomer or monomers such as methacrylic acid, acrylic acid, methyl acrylate, butyl acrylate, etc., styrene homopolymer and copolymers with a monomer or monomers such as acrylonitrile and/or butadiene, polyvinyl chloride, polyvinyl acetate, vinyl chloride-vinyl acetate copolymers, polyvinyl alcohol, polyvinyl pyrrolidone, polycarbonates, chlorinated polyolefins such as chlorinated polyethylene and chlorinated polypropylene, cellulose derivatives such as cellulose diactetate, cellulose triacetate and cellulose acetate butyrate, and mixtures thereof. The viscosity average molecular weight of the polymeric material for the support film is not critical and any polymeric material may be used so fas as it can be removed by dissolutin or dispersion into a liquid developer at the step of development. The viscosity average molecualr weight may be 5,00 to 1,000,000.

As described hereinbefore, the liquid developer to be used in this invention must be capable of dissolving or dispersing therein both of the unexposed areas of the photopolymerizable layer and the film support. As specific examples of an organic solvent as the developer, there can be mentioned ketones such as acetone and methyl ethyl ketone; esters such as methyl formate, methyl acetate, ethyl acetate and amy acetates; chlorinated hydrocarbons such as chloroform, trichloroethylene, 1,1,1-trichloroethane, 1,1,2-trichloroethane and methylene chloride; aromatic hydrocarbons such as benzene, toluene and xylene; alicyclic hydrocarobns such as cyclohexane; alcohols such as methanol, ethanol and isopropanol; cellosolves such as methyl cellosolve; and tetrahydrofuran. These solvents may be used either alone or in mixture.

As an organic polymer binder to be used in a photopolymerizable layer of the photosensitive element, there can be mentioned, for example, methyl methacrylate homopolymer and copolymers with a monomer or monomers such as methacrylic acid, acrylic acid, methyl acrylate, butyl acrylate, etc., styrene-acrylontrile copolymers, chlorianted polyolefines such as chlorinated polyethylene and chlorianted polypropylene, polyvinyl butyral and mixtures thereof. Of these organic polymers binders, methyl methacrylate homopolymer and copolymers are especially preferred from the viewpoint of the compatibility with a photopolymerizable monomer to be used for the photopolymerizable layer and/or the affinity with the liquid developer such as mentioned above. The viscosity average molecular weight of the organic polymer binder is not critical and any polymer binder may be used so far as it can be removed by dissolution or dispersion into a liquid developer at the step of developmemt. The viscosity average molecular weight may be 5,000 to 1,000,000.

In general, an appropriate liquid developer is chosen according to the kinds of the organic polymer binder for the photopolymerizable layer and the polymeric material for the film support. For example, when the binder and the support film are of acrylic polymers, e.g., polymethyl methacrylate, ketones and/or chlorinated hydrocarbons are used as the liquid developer, while ketones are used for vinyl chloride type polymers and ketones and/or esters are used for cellulose derivatives. When the kind of the organic binder is different from that of the support film, a common solvent for both of them or an appropriate mixture of solvents is chosen and employed as the liquid developer.

In this invention, development may be effected by dissolution of the unexposed areas of the photopolymerizable layer and the film support. Alternatively, development may be accomplished by swelling of the layer and/or the support and subsequent dispersion and removal thereof. For example, when polyvinyl butyral is used as the binder of the photopolymerizable layer and polyvinyl alcohol or polyvinyl pyrrolidone is used as the support, a liquid mixture of water and ethanol may be used as the liquid developer.

The photopolymerizable layer may comprise a photopolymerizable monomer, an organic polymer binder such as mentioned above, and a sensitizing agent such as a photopolymerization initiator. Ethylenically unsaturated compounds, especially acrylic polyfunctional monomers, are suitably employed as the photopolymerizable monomer. As the photopolymerizable monomer, those having at least 2 unsaturated bonds in their molecule are preferred because they provide crosslinkages by photopolymerization when exposed to actinic radiation. As acrylic monomers having 2 unsaturated bonds, there can be mentioned, for example, diacrylates such as polyethylene glycol diacrylate and polypropylene glycol diacrylate, and dimethacrylates such as polyethylene glycol dimethacrylate and polypropylene glycol dimethacrylate, and as acrylic monomers having 3 unsaturated bonds, there can be mentioned, for example, triacrylates such as pentaerythritol triacrylate and trimethylolpropane triacrylate and trimethacrylates such as pentaerythritol trimethacrylate and trimethylolpropane trimethacrylate. The viscosity average molecular weight of polyethylene glycol diacrylate, polypropylene glycol diacrylate, polyethylene glycol dimethacrylate and polypropylene glycol dimethacrylate as mentioned above is not critical but is usually up to 10,000, preferably up to 5,000. Other ethylenically unsaturated compounds that can be used as the photopolymerizable monomer are, for example, those as disclosed in U.S. Pat. No.3,469,982, polyvinyl cinnamate and polyacrylamide. These monomers may be used either alone or in mixture. The ratio of the amount of the photopolymerizable monomer to the amount of the organic polymer binder may be chosen within a broad range according to the kinds of the monomer and the binder so far as a desired image can be obtained from the photopolymerizable layer prepared therefrom. In general, the photopolymerizable monomer is used in an amount of 10 to 500 parts by weight, preferably 20 to 200 parts by weight, per 100 parts by weight of the binder.

The kind of a photopolymerization initiator to be used as the sensitizing agent is not particularly critical in this invention, and any of known photopolymerization initiators can be used. Specific examples of such photopolymerization initiators include carbonyl compounds such as benzoin, benzoin $C_1$–$C_4$ alkyl ethers, benzophenone, anthraquinone, 2-methylanthraquinone, 2-tert-butylanthraquinone, 9,10-phenanthrenequinone, diacetyl and benzil; peroxides such as hydrogen peroxide, di-tert-butyl peroxide, benzoyl peroxide and methyl ethyl ketone peroxide; organic sulfur-containing compounds such as di-n-butyl disulfide, 2-mercaptobenzothiazole, 2-mercaptobenzoxazole, 2-mercaptobenzimidazole, thiophenol, thiocresol, carboxymethyl-N,N-dimethyldithiocarbamate and ethyl trichloromethanesulfonate; redox initiators such as ferrous ion-peroxide such as hydrogen peroxide, ferric ion-peroxide such as hydrogen peroxide and ferrous ion-persulfate ion; photoreducible dyes such as Rose Bengale, Erythrocin, Eosine, acriflavine and Thionine; halogen compounds such as chloromethylnaphthyl chlorides, phenacyl chloride, chloroacetone, $\beta$-naphthalenesulfonyl chloride and xylenesulfonyl chlorides; and azo or diazo compounds such as $\alpha,\alpha'$-azobisisobutyronitrile, 2-azobis-2-methylbutyronitrile and a diazonium salt, e.g. a diazonium chloride, of p-aminodiphenylamine. In the above-mentioned redox initiators, the source of ferrous ion may be ferrous chloride, the source of ferric ion may be ferric chloride and the source of persulfate ion may be ammonium persulfate. The ratio of the amount of the photopolymerization initiator to the amount of the photopolymerizable monomer can be chosen within a broad range according to the kinds of the monomer and the photopolymerization initiator so far as a desired image can be obtained. In general, it is preferred that the amount of the photopolymerization initiator be 0.1 to 20 parts by weight, especially 1 to 10 parts by weight, per 100 parts by weight of the monomer.

In this invention, it is noted that the photopolymerizable layer may be of a multi-layer type in which the respective layers have successively increased concentrations of the photopolymerization initiator with increase in their distances from the film support. In the case of such a multi-layer type photopolymerizable layer, insufficient exposure to actinic radiation in the portions of the layer remote from the film support is compensated by the increased amount of the initiator to provide substantially uniform photopolymerization with respect to the vertical direction of the photopolymerizable layer. The substantially uniformly photopolymerized image gives, after development thereof, an image resist having substantially vertical lateral faces. Usually, a photopolymerizable layer having two layers differing in the concentration of the initiator is provided for attaining the above-mentioned purpose. In this case, the concentration of the photopolymerization initiator in the layer on the side remote from the film support is suitable 1.5 to 10 times that in the layer on the side of the film support.

The photopolymerizable layer may include a polymerization inhibitor. As the polymerization inhibitor, there can be used, for example, p-methoxyphenol, hydroquinone, hydroquinones substituted with an alkyl group such as methyl or ethyl or an aryl group such as phenyl, t-butylcatechol, pyrogallol, cuprous chloride, phenothiazine, chloranil, naphthylamines, β-naphthol, 2,6-di-t-butyl-p-cresol, pyridine, nitrobenzene, dinitrobenzenes, p-toluidine, Methylene Blue and copper salts of organic acids such as acetic acid. The amount of the polymerization inhibitor may vary according to the kinds of the photopolymerizable monomer and the polymerization inhibitor. In general, however, the polymerization inhibitor is used in an amount of 0.01 to 5 parts by weight per 100 parts by weight of the photopolymerizable monomer.

In connection with the use of a polymerization inhibitor, it is noted that the photopolymerizable layer may be of another multi-layer type in which the respective layers have successively decreased concentrations of the polymerization inhibitor with increase in their distances from the film support. In the case of such a multi-layer type photopolymerizable layer, substantially uniform photopolymerization with respect to the vertical direction of the photopolymerizable layer is attained by exposure of the layer to actinic radiation. The substantially uniformly photopolymerized image gives, after development thereof, an image resist having substantially vertical lateral faces. Usually, for attaining the above-mentioned purpose, there is provided a photopolymerizable layer having two layers differing in the concentration of the inhibitor. In this case, the concentration of the polymerization inhibitor in the layer on the side remote from the film support is suitably 0.01 to 0.5 time that in the layer on the side of the film support.

In order to increase the visibility of the image, a coloring agent may be incorporated into the photopolymerizable layer. Any of coloring agents as used commonly in this field may be employed. For example, there can be used titanium dioxide, carbon black, Crystal Violet, azo pigments, iron oxides, phthalocyanine pigments, Methylene Blue, Rhodamine B, Fuchsine, Auramines, azo dyes and anthraquinone dyes. In case a pigment is used as the coloring agent, it is incorporated in an amount of 0.1 to 25 parts by weight, preferably 0.1 to 5 parts by weight, per 100 parts by weight of the sum of the binder and the monomer. In case a dye is used as the coloring agent, it is incorporated in an amount of 0.01 to 10 parts by weight per 100 parts by weight of the sum of the binder and the monomer.

A nitrogen-containing heterocyclic compound may be incorporated into the photopolymerizable layer according to need. Any of nitrogen-containing heterocyclic compounds as used commonly in this field can be used. For example, there may be used benzimidazole, 2-aminobenzimidazole, 5-nitrobenzimidazole, 5-methylbenzimidazole, benzotriazole, 1-chlorobenzotriazole and 2-aminobenzothiazole. By incorporation of such a nitrogen-containing heterocyclic compound into the photopolymerizable layer, the tack of the photopolymerizable layer to a metal-clad substrate or a metal substrate can be improved. In general, it is preferred that the nitrogen-containing heterocyclic compound be incorporated in an amount of 0.1 to 10 parts by weight, especially 0.5 to 5 parts by weight, per 100 parts by weight of the sum of the binder and the photopolymerizable monomer. Alternatively or additionally, an adhesive may be applied onto the substrate for improving the adherence between the photopolymerizable layer and the substrate.

Further, a plasticizer may be incorporated into the photopolymerizable layer according to need. Any of plasticizers as used commonly in this field can be used in this invention. For example, there can be used phthalic acid esters such as dimethyl phthalate, diethyl phthalate, dibutyl phthalate and dioctyl phthalate; glycol esters such as dimethyl glycol phthalate and ethyl phthalyl ethyl glycolate; phosphoric acid esters such as tricresyl phosphate and triphenyl phosphate; and esters of aliphatic dibasic acids such as diisobutyl adipate, dioctyl adipate and dimethyl sebacate. The plasticizer is used in an amount of 0.1 to 30 parts by weight, preferably 2 to 10 parts by weight, per 100 parts by weight of the sum of the organic polymer binder and the photopolymerizable monomer.

As described before, positive working photodegradable compositions can be used as another type photosensitive composition in the process of producing an image according to this invention. As an organic polymer binder to be used for the positive working photosensitive layer, there can be mentioned, for example, methyl methacrylate copolymers with acrylic acid and/or methacrylic acid, novolak resins, cellulose derivatives such as cellulose acetate succinate, and mixtures thereof. With respect to the film support, a film made of an aqueous solvent-soluble polymer such as polyvinyl alcohol, polyvinyl pyrrolidone, cellulose acetate succinate, or the like may advantageously be used as the film support. The term "aqueous solvent" as used herein includes water alone and an aqueous solution of an acid or alkali. As the photodegradable compositions, there may advantageously be employed those containing an o-quinone diazide because they have an excellent resolution. When the o-quinone diazide type photosensitive composition is employed, an aqueous alkali solution may be used as the liquid developer.

A photosensitive element to be used for producing an image according to this invention is easily prepared, for example, as follows. A solution of a photosensitive composition is coated onto a plate or film having release properties to form a photosensitive layer and the photosensitive layer is transferred to a support film to give a photosensitive element having no protective film. In case a support film has resistance to solvent attack of a solution of a photosensitive composition, the solution may be directly coated onto the support film to form a photosensitive element. In the case of a photosensitive element having a protective film, a solution of a photosensitive composition is coated onto a protective film to form a photosensitive layer and the photosensitive layer with the protective film is laminated onto a support film. Instead of lamination, a polymer solution or emulsion may be coated onto the photosensitive layer to form a support layer. Such a support layer is, of course, included in the definition of the term "film support" or "support film" as used herein.

The photosensitive element for producing an image according to this invention comprises an unoriented or oriented transparent film support made preferably of a polymeric material selected from the polymers mentioned hereinbefore and a photosensitive layer. An appropriate liquid developer capable of dissolving or dispersing therein both of the film support and the non-imaged portions of the layer is chosen from among the aforementioned solvents and is used for development. However, it should be noted that advantageously employable liquid developers are not limited to those exemplified hereinbefore.

The term "liquid developer" as used herein is intended to mean a liquid capable of removing the film support and the non-imaged areas of the layer to form an image. Accordingly, even if a liquid is incapable of dissolving away the film support and/or the non-imaged areas of the layer, it can be used as a developer in case it is capable of removing, by any means, the film support and the non-imaged areas of the layer by any treatment with the liquid developer.

The thickness of the photosensitive layer that is used in this invention is preferably 0.1 to 1,000μ, more preferably 1 to 100μ. The thinner the photosensitive layer, the more the resolution is improved.

The thickness of the unoriented or oriented transparent film support is preferably 5 to 100μ, more preferably 10 to 50μ. This is so because the transparent film support must impart to the photosensitive element a strength sufficient to resist the stripping of the protective film and resist the lamination to the substrate so as to avoid deformation of the photosensitive element, and also because the time required for development can be shortened as the transparent film support is thin. The oriented film support may be obtained by a customary process, for example, stretching-orientation or rolling-orientation. A biaxially oriented film support is most suitably employed as the film support.

In general, an oriented transparent support is thin and nevertheless imparts a sufficient nerve to a photosensitive element. Further, in this case, the dissolution of the film support is facilitated by the residual internal stress due to molecular orientation and therefore, the development time can be shortened. Moreover, by the use of a thin film support, the range of scattering of actinic rays in the film can be narrowed to improve the resolution of the image. Thus, various practical advantages can be attained by the use of an oriented transparent film support.

An appropriate protective film may be chosen from among known materials. As the protective film, there can be mentioned, for example, a polyethylene terephthalate film, a polypropylene film, a polyethylene film, a cellulose triacetate film, a cellulose diacetate film, a polyamide film, a polytetrafluoroethylene film, a paper, a polyethylene-laminated paper and a polypropylene-laminated paper. The thickness of the protective film is 8 to 80μ, preferably 10 to 30μ.

As the substrate for producing thereon an image, there can be mentioned, for example, a laminate board with its surface or surfaces etchable by an etching liquid, a metal plate such as a copper, aluminum, iron, brass, silver, gold or stainless steel plate, a glass plate and a stone plate. The laminate boards with its surface or surfaces etchable, e.g. copper-clad substrate and aluminum-clad substrate, are useful for producing a printed circuit board according to the process of the present invention.

As the light source for exposure to actinic radiation, there can be used, for example, a high pressure mercury lamp, a super high pressure mercury lamp, a low pressure mercury lamp, a xenon lamp, a carbon arc lamp and a fluorescent lamp. Besides actinic rays from these light sources, there may be used X-rays, laser rays and electron rays for imagewise exposure.

As will be apparent from the foregoing illustration, the troublesome step of stripping the film support before or after exposure can be omitted according to this invention. Since the film support need not be stripped, the thickness of the photosensitive layer can be remarkably reduced without the cohesion of the photosensitive layer being taken into account. As a result, the resolution of the image can be remarkably improved. Further, when the photosensitive element for practicing the process of this invention is laminated to the substrate with heating, since the film support need not be stripped, the temperature need not be elevated to such a high level as adopted in the conventional technique. Further even if the adhesion between the photosensitive layer and the substrate is small, good results are obtained if only the adhesion between the image formed by the development and the substrate is sufficient to resist the subsequent treatment such as etching. Therefore, handling of the photosensitive element can be remarkably simplified and facilitated in this invention. Still further, nonuniform adhesion between the photosensitive layer and the substrate owing to nonuniform heating or pressing is no longer a problem in this invention.

The photosensitive element and the process for producing an image according to this invention may advantageously be utilized for the production of printed circuit boards, but the application field of this invention is not limited to the production of printed circuit boards. For example, the process of this invention is effectively applicable to chemical milling or processing of semiconductors. The process can also be applied to the production of photoreliefs such as those for a printing plate, a name plate, decorative articles and the like.

The process for producing an image according to this invention can be applied advantageously to the various conventional methods for producing printed circuit boards by means of photoresists. Two distinct methods of the manufacture of printed circuit boards for use in electrical or electronic equipments have, in general, been proposed in the prior art. One is called the "subtractive" method, and the other method is called the "additive" method. The "subtractive" method utilizing a photographic reproduction process consists, in general, in clothing one or both sides of an insulating substrate with a conductive metal foil, covering the conductive metal-clad substrate with a photosensitive material layer, exposing the photosensitive layer to actinic radiation through a pattern mask to form a latent image of the desired circuit and subjecting the image-bearing substrate to development using a solvent capable of removing the non-imaged portions of the photosensitive material layer thereby to form a photoresist having a positive image of the desired circuit, followed by etching away of the metal foil in the areas unprotected by the photoresist to form the circuit conductor. When the substrate has on its both sides conductive metal layers and is provided with through-holes, following etching, the entire surfaces of both sides are covered, except portions corresponding to the through-holes, with a resist and the inner wall surfaces of the through-holes are plated with an electroless deposit of a conductive metal, optionally followed by electro-deposition of a conductive metal on said electroless deposit (see, for example, German Offenlegungsschrift 24 27 610). An alternative to the "subtractive" method has been proposed heretofore, and is known as the "additive" method of manufacturing printed circuit boards. The "additive" method utilizing a photographic reproduction process consists, in general, in covering a bare substrate free of any conductive metal foil with a photosensitive material layer, exposing the photosensitive layer to actinic radiation through a pattern mask to form a latent negative image of the desired circuit and subjecting the image-bearing substrate to development using a solvent capable of removing the nonimaged portions of the photosensitive material layer thereby to form a photoresist having a negative image of the desired circuit, followed by electroless deposition of a conductive metal onto the areas unprotected by the photoresist, optionally further followed by electrodeposition of a conductive metal thereonto, to form the conductor portions of the circuit. As an improvement of the "additive" method, there is known a method which involves the steps of punching a bare substrate to provide necessary through-holes, plating an initial thin deposit of a conductive metal over the entire surface using an electroless metal plating bath, then applying and developing a photoresist to form a negative image of the desired circuit, followed by additional metal plating by electro-deposition to build up the conductor portions of the circuit to a desired thickness, whereupon the photoresist is removed from the non-circuit portions and the initial thin electroless metal deposit is etched away therefrom. In any of the methods in which an electroless plating procedure is involved, the catalyst for electroless plating is generally applied on the surface to be plated or incorporated in the substrate itself.

As is easily understood to those skilled in the art, the process for producing an image and the photosensitive element according to the present invention can be advantageously utilized for formation of the photoresists functioning as the etching-resist and the plating-resist in the above-mentioned "subtractive" method and "additive" method, respectively.

Furthermore, it is noted that as the modification of the above-mentioned "subtractive" method it is known to provide printed circuit boards of the type in which the substrate has on its both sides conductor circuits and the conductor circuits formed on the opposite sides have electrical connection therebetween through conductive metal layers formed on the inner wall surfaces of the through-holes of the substrate. The present process for producing an image is applicable, with great advantages, especially to the manufacture of printed circuit boards of the type as mentioned above. In the conventional method for the production of printed circuit boards of this type, the printed circuit is formed by the method comprising forming a resist, by using an etching-resistant metal or ink having a masking capacity, on both surfaces of a conductive metal-clad substrate and the inner wall surfaces of the through-holes formed in the substrate, said inner wall surfaces having thereon respective conductive metal layers, and subjecting the resulting resist-bearing substrate to etching whereby predetermined, resist-unprotected areas of both surfaces of the metal-clad substrate are etched away. In this conventional method, the resist can be easily formed on the surfaces of the substrate, but it is difficult to form a resist securely on the inner wall surfaces of the through-holes. Therefore, there is a tendency that the conductive metal formed on the inner wall surfaces of the through-holes is also etched, thus causing the thickness of the conductive metal layer to be reduced in the etched portions of the inner wall surfaces of the through-holes. As a result, the resistance is increased in these portions, leading to lowering of the performance of the printed circuit board.

As a means for overcoming the foregoing defects, there has recently been proposed an improved method for forming printed circuit boards from a conductive metal-clad substrate having through-holes with their respective inner wall surfaces covered with conductive metal layers. The improved method consists in covering, with photosensitive layers, the surfaces of both sides of the metal-clad substrate including both openings of each of the through-holes thereby to close the openings of the through-holes, so that the conductive metal layer on the inner wall surface of each of the through-holes is protected from etching in the subsequent step for forming the circuit conductors by etching (see, for example, Japanese Patent Application Publication No. 3746/1971). In this improved method, for covering the surfaces of both sides of the metal-clad substrate with the photosensitive layers, there may advantageously be employed a photosensitive element comprising a releasing support such as a release paper and a photosensitive resin layer formed on said support and optionally a protective film provided on the surface of said layer remote from the releasing support. Examples of such a photosensitive element include Riston (registered trademark of a product manufactured and sold by Du Pont Company, U.S.A.) and Laminar (registered trademark of a product manufactured and sold by Thiokol/Dynachem Corp., U.S.A.). As described, Japanese Patent Application Publication No. 3746/1971 discloses a method which comprises applying one side of a photosenstive resin layer having on its other side a releasing support onto the surfaces of both sides of an insulating substrate having thereon conductive metal layers such as thin copper layers and having through-holes thereby to effect closure of at least both openings of the through-holes; in either order, imagewise exposing the photosensitive resin layers on both sides of the substrate to actinic radiation to form predetermined insolubilizable pattern images covering and closing at least both openings of each of the through-holes and removing the releasing supports from the photosensitive resin layers, followed by development; and etching the conductive metal layers in the areas other than the areas of said images as masking resists. In practicing this process, the releasing support must be removed from the photosensitive resin layer before the imagewise exposure if the releasing support is opaque, or before or after the imagewise exposure if the releasing support is transparent. In general, a photosensitive resin having a high tack is used for the photosensitive resin layer so as to attain a good adhesion between the photosensitive resin layer and the conductive metal layer, and in addition, when the photosensitive resin layer is laminated to the conductive metal layer, lamination is effected under application of pressure so as to secure good adherence. Accordingly, it is considerably difficult to remove the releasing support from the photosensitive resin layer having such a high tack. For this reason, a releasing support having good release characteristics, for example, a synthetic resin film or a waxed paper, is ordinarily used. Even in case such a releasing support having good release characteristics is used, however, various troubles tend to occur when the releasing support is removed from the photosensitive resin layer. For example, the photosensitive resin layer is peeled off together with the releasing support from the conductive metal layer, or pinholes are liable to be formed in the photosensitive resin layer. Further, adhesion of dusts are caused due to static charge generated by the removal of the releasing support. Therefore, the above-mentioned method cannot be commercially applicable to the production of printed circuit boards having good through-holes.

All of the foregoing disadvantages accompanying the conventional methods for the production of printed circuit boards can be eliminated according to this invention. Differently stated, according to this invention, printed circuit boards having good conductive metal layers on the inner wall surfaces of the through-holes can be prepared very simply while omitting the step of removing the releasing support from the photosensitive resin layer.

Accordingly, in a further aspect of this invention, there is provided a process for the production of a printed circuit board, which comprises the steps of:

(1) applying, to the surfaces of both sides of an insulating substrate having on its both sides conductive metal layers and having through-holes with their respective inner wall surfaces covered with conductive metal layers, the surface of a photosensitive composition layer having adherence to the substrate to cover and close at least both openings of each of the through-holes with the photosensitive composition layer, while the other surface of the photosensitive composition layer has adhered to a substantially transparent film support which is soluble or dispersible in a developer consisting essentially of a liquid capable of substantially dissolving or dispersing therein the areas of the layers other than those having polymeric images produced by imagewise exposure in the step (2) below and capable of transmitting actinic rays, the application of the surface of the photosensitive composition layer to the surface of the substrate being effected after stripping of a protective film in case the protective film has been provided on the surface of the photosensitive composition layer remote from the film support;

(2) exposing the photosensitive composition layers on both sides of the substrate, imagewise, to actinic radiation through the respective film supports to form in the layers polymeric images covering at least both openings of each of the through-holes;

(3) washing away with the developer the film supports and the areas of the layers other than those having the polymeric images to form polymeric image patterns on both sides of the substrate; and (4) etching the conductive metal layers in the areas other than the areas of the polymeric image patterns as masking resists.

In the above-mentioned method, either a negative working photosensitive composition capable of polymerizing by exposure or a positive working photosensitive composition capable of degrading by exposure may be used for the photosensitive composition layer. As the negative working photosensitive composition, there can be used the aforementioned compositions comprising an organic polymer binder, an ethylenically unsaturated compound and a sensitizing agent. As the positive working photosensitive composition, there can be preferably used the aforementioned compositions comprising an o-quinone diazide.

Liquid developers capable of dissolving or dispersing therein the non-imaged areas of the photosensitive composition layer and the support layer, such as exemplified hereinbefore, can be used as the developer for the manufacture of through-hole printed circuit boards.

Other objects, features and advantages of the method according to the instant aspect of this invention will be better understood from the description taken in connection with the accompanying drawings in which:

FIGS. 1 to 3 and 5 to 9 are diagrammatic sectional views illustrating by way of example the successive steps of manufacturing a printed circuit board according to the instant aspect of this invention; and FIG. 4 is a diagrammatic sectional view of one form of a photosensitive element to be used in practicing the process of this invention.

Referring now to FIGS. 1 to 9, the method of the producing a printed circuit board by the use of a negative working photosensitive element will be explained as one embodiment of the instant aspect of this invention.

Figure 7:
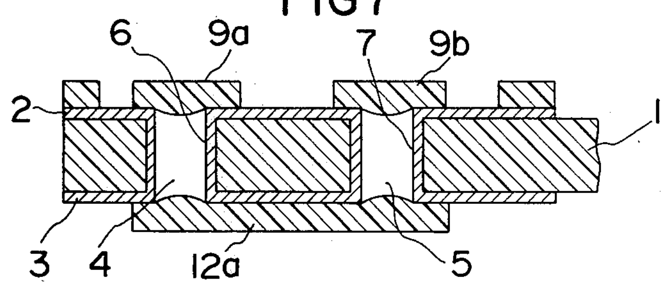
Figure 8:
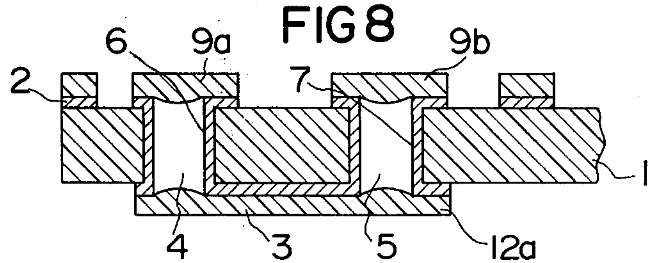
Figure 9:
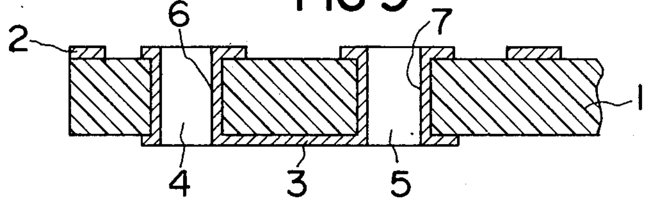

As is shown in FIG. 1, both surfaces of an insulating substrate 1 made of, for example, a phenolic or epoxy resin are clad with copper foils to form thin copper layers 2 and 3. Then, as is shown in FIG. 2, through-holes 4 and 5 are formed at predetermined portions by drilling or punching. In FIG. 3, the inner wall surfaces of the through-holes 4 and 5 are subjected to electroless plating to form an initial thin deposit of copper and subsequently, to electro-plating to form through-hole conductor layers 6 and 7 of the desired thickness, which are thin copper layers. If a photosensitive element has a protective film 10 made of polyethylene or the like as is shown in FIG. 4, the protective film is peeled off. The surfaces of photopolymerizable layers 9 and 12, which are remote from film supports 8 and 11, are applied to both surfaces of the copper-clad insulating substrate under application of an appropriate pressure at about 0° to about 160° C. to form a laminate board, whereby at least both openings of each of the through-holes 4 and 5 whose inner wall surfaces have respectively the through-hole conductor layers 6 and 7 are covered with the photopolymerizable layers 9 and 12 as is shown in FIG. 5. The thickness of the photopolymerizable layers 9 and 12 is preferably 0.5 to 100$\mu$, more preferably 5 to 70$\mu$, though it is not particularly critical. Then, as is shown in FIG. 6, the photopolymerizable layers are imagewise exposed through negative films 13 and 14 to actinic radiation to form in the photopolymerizable layers polymeric images insoluble in the liquid developer. Then, as is shown in FIG. 7, the film supports 8 and 11 and the unexposed nonimaged areas of the layers are dissolved away or dispersed away and removed using a liquid developer by means of an adequate development method such as a spray development method. In the method according to the instant aspect of this invention, it is indispensable that at least both openings of each of the through-holes 4 and 5 should be completely covered with photopolymerized areas 9*a*, 9*b* and 12*a* insoluble in the liquid developer. The development may be effected in sequence or simultaneously for each of both sides of the laminate board. Subsequently, the resulting board is dipped in an etching solution containing ferric chloride or the like to effect etching of the thin copper layers 2 and 3. The portions of the thin copper layers other than those covered with the insoluble photopolymerized areas 9*a*, 9*b*, 12*a*, etc. of the polymeric images as masking resists are etched away with the etching solution to form desired conductor patterns as is shown in FIG. 8, followed by washing with water. Then, as is shown in FIG. 9, the insoluble photopolymerized areas 9*a*, 9*b*, 12*a*, etc. of the polymeric images are removed by dipping in methylene chloride or the like, followed by washing. According to need, the thin copper layers 2 and 3 and the through-hole conductor layers 6 and 7 are plated with gold or solder. Thus, there is obtained a printed circuit board having excellent quality through-hole conductor layers 6 and 7.

As will be apparent from the foregoing illustration, when a printed circuit board is produced according to the method of this invention, the step of removing the releasing support is not needed, leading to the simplification of the manufacturing process. Further, such problems accompanying the conventional method as the peeling-off of a photosensitive resin layer from the conductive metal layer, the formation of pinholes and the adhesion of dusts by static charge at the step of stripping a releasing support need not be cared for at all in the method of this invention. Accordingly, a printed circuit board having through-holes with their respective inner walls covered by excellent conductor layers can be mass-produced, without giving poor quality products, with commercial advantages.

Further, it is noted that the photosensitive element according to this invention may advantageously be manufactured in the form of a longitudinally elongated strip that can be wound into a roll, from the viewpoint of handling, storage, etc.

The following Examples illustrate this invention in more detail, but are not to be construed as limiting the scope thereof.

In Examples, "resolution" is evaluated as follows. According to the process of this invention, a plurality of polymeric images are produced using a photosensitive element and a plurality of mask films which differ in the line width of the image composed of transparent lines having a given width and opaque lines having the same width as that of the transparent lines. Each polymeric image is visually observed through a microscope to determine whether or not the polymeric image has recognizable lines. The minimum line width among the line widths of the images of those mask films which can give a polymeric image having recognizable lines is defined as the "resolution" of the photosensitive element.

The viscosity average molecular weight (Mv) shown in this specification is calculated from the intrinsic viscosity $[\eta]$ at 25° C. of a solution of a polymer material in a solvent, using the following equation. The intrinsic viscosity is examined using Ostwald's viscometer.

$$[\eta]=K\overline{M}_v^{\alpha}$$

(wherein K and $\alpha$ are constants inherent of the kind of a polymeric material).

For example, with respect to polymethyl methacrylate and polystyrene, solvents to be used and constants K and $\alpha$ are listed as follows.

| | Solvent | K | $\alpha$ |
|---|---|---|---|
| Polymethyl methacrylate | chloroform | $4.85 \times 10^{-6}$ | 0.80 |
| Polystyrene | benzene | $1.0 \times 10^{-4}$ | 0.74 |

The viscosity average molecular weight ($\overline{M}v$) is substantially the same as the weight average molecular weight ($\overline{M}w$).

In Examples, a film support is often referred to simply as "support".

EXAMPLE 1

A solution for a photopolymerizable layer was prepared of the following ingredients:

| | |
|---|---|
| Methyl methacrylate/methacrylic acid copolymer (molar ratio = 90/10; $\overline{M}_v$ = 120,000) | 40 g |
| Trimethylolpropane triacrylate | 15 g |
| 2-Ethylanthraquinone | 0.5 g |
| Methyl violet (C.I. 42535) | 0.1 g |
| p-Methoxyphenol | 0.15 g |
| Methyl ethyl ketone | 140 g |

The so prepared solution was coated onto a 25 μ-thick polyethylene terephthalate film and dried at 80° C. for 5 minutes to form a photopolymerizable layer having a dry thickness of 12μ. A 20 μ-thick biaxially oriented polystyrene film Styrofilm (registered trademark of a product manufactured and sold by Asahi-Dow Limited, Japan) as a support was laminated onto the photopolymerizable layer using a pressure roller to form a photosensitive element.

A copper-clad epoxy resin-fiber glass substrate was degreased with trichloroethylene, dipped for 30 seconds in a 10% by weight aqueous solution of hydrochloric acid, washed with water, coarsened by a surface abrasion machine [a roll Scotchbrite (registered trademark) 7 VF (manufactured and sold by Minnesota Mining and Manufacturing Company, U.S.A.) was used], washed with water and then dried.

The polyethylene terephthalate film as the protective film of the photosensitive element was stripped, and the photopolymerizable layer with its support was laminated through nip rolls onto the so treated copper-clad substrate heated at 90° C. to form a laminate board. The lamination pressure was 2.0 $Kg/cm^2$.G and the lamination speed was 1.0 m/min. The adhesion between the biaxially oriented polystyrene film as the support and the photopolymerizable layer was very large, and therefore when it was tried to separate them forcibly from each other, the film support was broken or peeling-off took place between the copper surface and the photopolymerizable layer.

The photopolymerizable layer of the so formed laminate board was exposed for 45 seconds through a negative image to actinic rays from a 3 KW high pressure mercury lamp (manufactured by Ushio Electric Inc., Japan) located at a distance of 50 cm from the surface of the support. Then, 1,1,1-trichloroethane was jetted for 60 seconds to the laminate board from a spray nozzle to dissolve away and remove the support film and the unexposed areas of the photopolymerizable layer, whereby a resist image was obtained. The resolution was examined and clear lines of 25μ in width were observed. A 50° C., 45° Baumé ferric chloride solution was jetted to the laminate board by a nozzle type etching machine to remove copper at the areas unprotected by the resist image. By this etching treatment, the resist image did not undergo any change and remained firmly adhered to the copper-clad substrate. The etched laminate board was then washed with water and dried, and the resist was removed using methylene chloride. A copper pattern having a line width of 25μ was clearly obtained.

EXAMPLE 2

A solution for a photopolymerizable layer was prepared of the following ingredients:

| | |
|---|---|
| Styrene/acrylonitrile copolymer | 50 g |
| (molar ratio = 85/15; $\overline{M}_v$ = 150,000) | |
| Pentaerythritol triacrylate | 15 g |
| 2-Methylanthraquinone | 0.5 g |
| Victoria Blue (C.I. 42563) | 0.2 g |
| Methyl ethyl ketone | 280 g |

The so prepared solution was coated onto a 50 μ-thick polypropylene film to form a photopolymerizable layer having a dry thickness of 15μ. This photopolymerizable layer was laminated onto a 15 μ-thick biaxially oriented polystyrene film. Lamination onto a substrate, exposure and development were conducted in the same manner as described in Example 1. The resolution was 30μ. The resist image did not undergo any change by the etching treatment, and a good pattern was obtained when the resist was removed.

EXAMPLE 3

A solution for a photopolymerizable layer was prepared of the following ingredients:

| | |
|---|---|
| Chlorinated polyethylene [Super Chlon (registered trademark) 907LTA manufactured and sold by Sanyo-Kokusaku Pulp Co., Ltd., Japan] | 21 g |
| Polymethyl methacrylate [Delpowder (registered trademark) 80N manufactured and sold by Asahi Kasei Kogyo K.K., Japan] | 9 g |
| Trimethylolpropane triacrylate | 20 g |
| Benzophenone | 0.5 g |
| Michler's ketone | 0.25 g |
| Malachite Green (oxalate) | 0.1 g |
| Methyl ethyl ketone | 150 g |

The solution was coated onto a 50 μ-thick polypropylene film to form a photopolymerizable layer having a dry thickness of 10μ. Then, the polypolymerizable layer was laminated onto a 20 μ-thick biaxially oriented polymethyl methacrylate film as a support. The polypropylene film was stripped and the photopolymerizable layer with its support was laminated through nip rolls onto a copper-clad epoxy resin substrate heated at 100° C. The lamination pressure was 4.0 Kg/cm$^2$.G and the lamination speed was 1.5 m/min. Exposure and development were carried out under the same conditions as adopted in Example 1. The resolution was 20μ. The resist image was stable even after the etching treatment, and when the resist was removed, a good pattern was obtained.

EXAMPLE 4

The solution prepared in Example 1 was coated onto a 25 μ-thick polyethylene terephthalate film to form a photopolymerizable layer having a dry thickness of 10μ, and the photopolymerizable layer was laminated onto a 20 μ-thick unoriented polycarbonate film as a support to form a photosensitive element. Then, the polyethylene terephthalate film was stripped, and the photopolymerizable layer with its support was laminated with pressing onto a copper-clad epoxy resin substrate heated at 100° C. to form a laminate board. The lamination pressure was 2.5 Kg/cm$^2$.G and the lamination time was 30 seconds. Then, the photopolymerizable layer of the laminate board was exposed for 30 seconds through a negative image to actinic rays from a 2 KW super-high pressure mercury lamp (manufactured by Ork Manufacturing Co., Ltd., Japan) located at a distance of 50 cm from the surface of the support. Tetrahydrofuran was jetted for 45 seconds to the laminate board from a spray nozzle to dissolve away and remove the film support and the unexposed areas of the photopolymerizable layer and obtain a resist image. The resolution was examined, and clear lines of 30μ in width were observed. The laminate board was then etched by a spray nozzle type etching machine under the same conditions as adopted in Example 1. The resist image did not undergo any change and it remained adhered firmly to the copper-clad substrate. The laminate board was washed with water and dried, and the resist was removed using methylene chloride to obtain a good copper pattern consisting of lines of 30μ in width.

EXAMPLE 5

A solution for a photopolymerizable layer was prepared in the same manner as described in Example 3, and the solution was coated onto a 50 μ-thick polypropylene film to form a photopolymerizable layer having a dry thickness of 15μ. The coated film was laminated onto a 20 μ-thick biaxially oriented polyvinyl chloride film as a support to obtain a photosensitive element. The polypropylene film was stripped and the photopolymerizable layer with its support was laminated onto a copper-clad epoxy resin substrate heated at 100° C. Exposure and development were carried out under the same conditions as adopted in Example 4 to obtain a resist image. When the resolution was examined, it was found to be 30μ. Even after the etching treatment, the resist image was stable, and when the resist was removed, a good pattern was obtained.

EXAMPLE 6

A solution for a photopolymerizable layer was prepared of the following ingredients:

| | |
|---|---|
| Cellulose acetate butyrate | 30 g |
| ($\overline{Mv}$ = 60,000) | |
| Trimethylolpropane triacrylate | 10 g |
| 2-Methylanthraquinone | 0.5 g |
| Victoria Blue (C.I. 42563) | 0.2 g |
| Methyl ethyl ketone | 160 g |

The so prepared solution was coated onto a 25 μ-thick polyethylene terephthalate film to form a photopolymerizable layer having a dry thickness of 10μ. A 15 μ-thick unoriented cellulose diacetate film was laminated onto the surface of the photopolymerizable layer using a pressure roller to obtain a photosensitive element. The polyethylene terephthalate film as the protective film of the photosensitive element was stripped, and the photopolymerizable layer was laminated onto a copper-clad phenolic resin substrate with pressing at room temperature to form a laminate board. In substantially the same manner as described in Example 1, the photopolymerizable layer of the laminate board was exposed to actinic rays and development was effected with acetone to form a resist image. This resist image was clear and sufficiently resisted an etching treatment by the use of a ferric chloride solution. When the resist was removed after the etching treatment, a good pattern was obtained.

COMPARATIVE EXAMPLE 1

In the same manner as described in Example 1, a photopolymerizable layer having a dry thickness of 12μ was formed on a 25 μ-thick polyethylene terephthalate film as a support. In substantially the same manner as described in Example 1, the photopolymerizable layer with its support was laminated with pressing onto a copper-clad epoxy resin substrate heated at 90° C. and exposure to actinic rays was effected. When the polyethylene terephthalic film was stripped, part of the photopolymerizable layer remained adhered to the copper-clad substrate and the other part of the photopolymerizable layer remained adhered to the polyethylene terephthalate film. Thus, the photopolymerizable layer was destroyed and the image was in disorder.

COMPARATIVE EXAMPLE 2

A photopolymerizable layer formed on a 50 μ-thick polypropylene film as a support in the same manner as described in Example 3 was laminated onto a copper-clad epoxy resin substrate heated at 100° C. in substantially the same manner as described in Example 3 to form a laminate board. Exposure to actinic ray was effected in substantially the same manner as described in Example 1. When the polypropylene film as the support was stripped, the photopolymerizable layer was destroyed and remained adhered to both the film support and the copper surface. Accordingly, it was practically useless to subject the resulting laminate board to development.

EXAMPLE 7

A solution for a photopolymerizable layer was prepared in substantially the same manner as described in Example 1 except that the amount of 2-ethylantraquinone as a photopolymerizable initiator was 1.5 g instead of 0.5 g. This solution was referred to as a solution A. The same solution as prepared in Example 1 was referred to as a solution B.

The solution A was coated onto a 25 μ-thick polyethylene terephthalate film and dried to form a layer A having a dry thickness of 12μ, and the solution B was coated onto the layer A and dried to form a layer B having a dry thickness of 12μ. A photopolymerizable layer having a total thickness of 24μ was obtained. The photopolymerizable layer was laminated onto a 20 μ-thick biaxially oriented polystyrene film.

In substantially the same manner as described in Example 1, lamination onto a copper plate, imagewise exposure and development was carried out to form a resist image on the copper substrate.

The so obtained resist image had substantially vertical lateral faces. It was not observed that the degree of polymerization in the layer A was lower than that in the layer B due to the scattering of actinic rays.

EXAMPLE 8

A solution for a photopolymerizable layer was prepared in substantially the same manner as described in Example 1 except that the amount of p-methoxyphenol as a polymerization inhibitor was 0.03 g instead of 0.15 g. This solution was referred to as a solution C. The same solution as prepared in Example 1 was referred to as a solution D.

The solution C was coated onto a 25 μ-thick polyethylene terephthalate film and dried to form a layer C having a dry thickness of 10μ, and the solution D was coated onto the layer C and dried to form a layer D having a dry thickness of 10μ. A photopolymerizable layer having a total thickness of 20μ was obtained. The photopolymerizable layer was laminated onto a 20 μ-thick biaxially oriented polystyrene film.

In substantially the same manner as described in Example 1, lamination onto a copper substrate, imagewise exposure and development were carried out to form a resist image on the copper substrate.

The cross-sections of the so obtained resist image was observed. The resist image had substantially vertical lateral faces and good cross-sections in a substantially rectangular shape. This effect was due to substantially uniform polymerization attained by providing in the photopolymerizable layer the layer C containing the smaller amount of the polymerization inhibiter in order to increase the photosensitivity of the layer C.

EXAMPLE 9

0.6 g of benzimidazole was added to the same solution as prepared in Example 1. The resulting solution was coated onto a 25 μ-thick polyethylene terephthalate film and dried to form a photopolymerizable layer having a dry thickness of 25μ. The photopolymerizable layer was laminated onto a 20 μ-thick biaxially oriented polystyrene film as a support to obtain a photosensitive element.

The polyethylene terephthalate film was stripped and the bared photopolymerizable layer was laminated onto a copper substrate in the same manner as described in Example 1 to form a laminate board. Exposure to actinic rays was effected in substantially the same manner as described in Example 1 except that a negative film was not used. Also, the same photopolymerizable layer with its support as prepared in Example 1 was laminated onto a copper substrate in the same manner as described in Example 1 to form a laminate board and exposed to actinic rays in the same manner as described above. 1,1,1-Trichloroethane was jetted to each laminate board in the same manner as described in Example 1 to remove the support. An epoxy resin adhesive Araldite (registered trademark) standard (manufactured and sold by Ciba-Geigy Co., Ltd., Switzerland) was applied onto the surface of a bared photopolymerized layer of each resulting laminate board, and a copper substrate was laminated onto the adhesive layer to form a sample laminate board.

The shear stress between the photopolymerized layer and the copper substrate to each sample laminate board was examined in accordance with ASTM-D1002-64. The shear stress between the photopolymerized layer containing benzimidazole and the copper substrate was 30 $Kg/cm^2$, while the shear stress between the photopolymerized layer containing no benzimidazole and the copper substrate was 18 $Kg/cm^2$. Thus, it was confirmed that benzimidazole exerted a marked effect with respect to the adhesion between the photopolymerized layer and the copper substrate.

EXAMPLE 10

A solution for a photosensitivie layer was prepared of the following ingredients:

| | |
|---|---|
| Methyl methacrylate/methacrylic acid copolymer | 5 g |
| (molar ratio = 99/10; $\overline{Mv}$ = 90,000) | |
| Cresol novalak resin Sumiliteresin (registered trademark of a product manufactured and sold by Sumitomo Bakelite Co., Ltd., Japan) | 15 g |
| 2-(Naphthoquinone-1,2,-diazide-5-sulfonyloxy)-7-oxynaphthalene | 10 g |
| Victoria Blue (C.I. 42563) | 0.3 g |
| Dioxane | 40 g |
| Ethylene dichloride | 30 g |

The so prepared solution was coated onto a 20 μ-thick unoriented polyvinyl alcohol film as a support and dried to form a photosensitive layer having a dry thickness of 20μ. The photosensitive layer with its support was laminated with pressing onto a copper-clad epoxy resin substrate heated at 80° C. to form a laminate board. The lamination pressure was 2.0 Kg/cm$^2$.G and the lamination time was 30 seconds. The photosensitive layer was exposed for 30 seconds through a positive film to actinic rays from the same high pressure mercury lamp as used in Example 1, which was located at a distance of 50 cm from the surface of the support. Subsequently, a liquid developer composed of an aqueous 0.5% by weight sodium hydroxide solution was jetted for 2 minutes to the laminate board from a spray nozzle to dissolve away and remove the support film and the exposed areas of the photosensitive layer. The obtained image has clearly defined lines of 30μ in width.

EXAMPLE 11

A solution for a photopolymerizable layer was prepared of the following ingredients:

| | |
|---|---|
| Methyl methacrylate/acrylic acid copolymer | 50 g |
| (molar ratio = 95/5; $\overline{Mv}$ = 150,000) | |
| Tetraethylene glycol diacrylate | 40 g |
| Methyl Violet (C.I. 42535) | 0.2 g |
| 2-Ethylanthraquinone | 4 g |
| Methyl ethyl ketone | 300 g |

The so prepared solution was coated onto a 40 μ-thick polyethylene film and dried at 80° C. for 2 minutes to form a photopolymerizable layer having a dry thickness of 30μ. A 25 μ-thick unoriented polyvinyl alcohol film as a support was laminated onto the photopolymerizable layer under application of pressure to form a photosensitive element.

The polyethylene film which was a protective film of the photosensitive element was stripped. Then, the photopolymerizable layer with its support was laminated onto the cleansed surface of a 1 mm-thick copper plate heated at 80° C., which copper plate had a protective coating on the other surface thereof. Subsequently, the photopolymerizable layer was exposed for 40 seconds to actinic rays from the same high pressure mercury lamp as used in Example 1, which was located at a distance of 50 cm from the surface of the support. Development was effected using a solution composed of 0.2% by weight of sodium hydroxide, 10% by weight of isopropanol and 89.8% by weight of water. The polyvinyl alcohol film as the support and the unexposed areas of the photopolymerizable layer were swollen, dispersed and removed to obtain a desired resist image.

The same ferric chloride solution as used in Example 1 was jetted for 2 minutes to the resist image-bearing copper plate to effect etching. After water-washing and drying, the resist was removed using methylene chloride. The resulting copper plate was cut into a circular form to form a decorative article.

EXAMPLE 12

A double-side copper-clad epoxy substrate was subjected to drilling to form through-holes having a diameter of 1.5 mm at the predetermined portions of the substrate, followed by deburring. The substrate was catalyzed, at the inner wall surfaces of through-holes, by an ordinary method using a palladium chloride solution, and subjected to electroless plating and electroplating to effect copper plating on the inner wall surfaces of the through-holes. A substrate having through-holes lined with an about 20 μ-thick copper conductor layer was obtained.

The so obtained substrate was heated to 90° C. The polyethylene terephthalate films were removed from sections of two pieces of the same photosensitive element as prepared in Example 1. The bared photopolymerizable layers with their supports were laminated onto both surfaces of the heated substrate through nip rolls to form a laminate board. The lamination pressure was 2.0 Kg/cm$^2$.G and the lamination speed was 1.0 m/min. The laminate board was exposed from both sides thereof for 45 seconds through negative films to actinic rays from the same super-high pressure mercury lamps as used in Example 4, which were located at a distance of 50 cm from each surface of the laminate board, to produce polymeric images covering both openings of each through-holes. 1,1,1-Trichloroethane was jetted for 60 seconds to the laminate board from a spary nozzle to dissolve away and remove the support films and the unexposed areas of the photopolymerizable layer, whereby resist images covering both the openings of each through-holes were obtained. A 50° C., 45 minutes Baumé ferric chloride solution was jetted to the laminate board by a spray type etching machine to remove copper at the areas unprotected by the resist images. At the etching step, the resist images did not undergo any change and effectively protected the through-hole portions. After water-washing and drying, the resists were removed using methylene chloride to obtain an excellent through-hole printed circuit board. The about 20 μ-thick copper conductor layers plated on the inner wall surfaces of the through-holes did not undergo any change.

What is claimed is:

1. A photosensitive element comprising a photopolymerizable composition layer and a transparent oriented film support laminated onto one surface of the photopolymerizable composition layer which support is soluble or dispersible in a liquid developer for the photopolymerizable composition layer and capable of transmitting actinic rays and which support is a styrene homopolymer or copolymer.

2. A photosensitive element according to claim 1, which further comprises a strippable protective film provided on the other surface of the photopolymerizable composition layer.

3. A photosensitive element according to claim 2, wherein said protective film is of a member selected from the group consisting of polyethylene terephthalate, polyamides, polypropylene and polyethylene.

4. A photosensitive element according to claim 1, wherein said photopolymerizable composition comprises an organic polymer binder, an ethylenically unsaturated compound and a photopolymerization initiator.

5. A photosensitive element according to claim 4, wherein said organic polymer binder is a homopolymer or copolymer of methyl methacrylate and the ethylenically unsaturated compound is an acrylic polyfunctional monomer.

6. A photosensitive element according to claim 1, wherein the layer of said photopolymerizable composition is developable with a liquid developer consisting essentially of a member selected from the group consisting of ketones, esters, alcohols, chlorinated hydrocarbons, aromatic hydrocarbons and mixtures thereof, and said transparent oriented film support is soluble or dispersible in said liquid developer.

7. A photosensitive element according to claim 1, wherein the thickness of said photopolymerizable composition layer is 0.1 to 1000μ.

8. A photosensitive element according to claim 7, wherein said thickness is 1 to 100μ.

9. A photosensitive element according to claim 1, wherein the thickness of said transparent oriented film support is 5 to 100μ.

10. A photosensitive element according to claim 9, wherein said thickness is 10 to 50μ.

11. A photosensitive element according to claim 1, which is in the form of a longitudinally elongated strip that is capable of being wound into a roll.

12. A photosensitive element according to claim 4, wherein said photopolymerizable composition constitutes a multi-layer in which the respective layers have successively increased concentrations of the photopolymerization initiator with increase in their distances from the film support.

13. A photosensitive element according to claim 4, wherein said photopolymerizable composition further includes a polymerization inhibitor and constitutes a multi-layer in which the respective layers have successively decreased concentrations of the polymerization inhibitor with increase in their distances from the film support.

14. A photosensitive element according to claim 4, wherein said photopolymerizable composition further includes a nitrogen-containing heterocyclic compound.

* * * * *